United States Patent
Toyotaka

(10) Patent No.: US 10,141,053 B2
(45) Date of Patent: Nov. 27, 2018

(54) METHOD FOR DRIVING A SEMICONDUCTOR DEVICE INCLUDING DATA MIGRATION BETWEEN A VOLATILE MEMORY AND A NONVOLATILE MEMORY FOR POWER-SAVING

(71) Applicant: SEMICONDUCTOR ENERGY LABORATORY CO., LTD., Atsugi-shi, Kanagawa-ken (JP)

(72) Inventor: Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 598 days.

(21) Appl. No.: 14/264,359

(22) Filed: Apr. 29, 2014

(65) Prior Publication Data

US 2014/0325249 A1   Oct. 30, 2014

(30) Foreign Application Priority Data

Apr. 30, 2013  (JP) ................... 2013-095552

(51) Int. Cl.
*G06F 1/32* (2006.01)
*G11C 14/00* (2006.01)

(52) U.S. Cl.
CPC ........ *G11C 14/0018* (2013.01); *G06F 1/3268* (2013.01); *G06F 1/3275* (2013.01); *Y02D 10/11* (2018.01); *Y02D 10/13* (2018.01); *Y02D 10/154* (2018.01)

(58) Field of Classification Search
None
See application file for complete search history.

(56) References Cited

U.S. PATENT DOCUMENTS

| | | | |
|---|---|---|---|
| 7,443,759 B1 * | 10/2008 | Rowlands | G11C 7/20 365/226 |
| 8,461,462 B2 | 6/2013 | Hayashi | |
| 8,635,511 B2 | 1/2014 | Takeuchi et al. | |
| 9,081,661 B2 | 7/2015 | Unesaki et al. | |

(Continued)

FOREIGN PATENT DOCUMENTS

| | | |
|---|---|---|
| JP | 2008-287492 A | 11/2008 |
| JP | 2008-287492 A | 11/2008 |

(Continued)

*Primary Examiner* — Kim Huynh
*Assistant Examiner* — Danny Chan
(74) *Attorney, Agent, or Firm* — Fish & Richardson P.C.

(57) ABSTRACT

To reduce power consumption of a processing device including a processor and a main memory in the processor. The main memory includes not only a volatile memory such as a DRAM but also a nonvolatile memory. The processor monitors access requirements to the main memory. The processor determines on the basis of the monitoring results whether the volatile memory or the nonvolatile memory operates mainly. In the case where the main memory changes from the volatile memory to the nonvolatile memory, part or all of data stored in the volatile memory is backed up to the nonvolatile memory. While the nonvolatile memory operates mainly, supply of power supply voltage to the volatile memory is stopped or power supply voltage to be supplied is lowered.

7 Claims, 9 Drawing Sheets

(56) References Cited

U.S. PATENT DOCUMENTS

| | | | | |
|---|---|---|---|---|
| 9,235,500 | B2* | 1/2016 | Worthington | G06F 12/0223 |
| 2004/0230851 | A1* | 11/2004 | Chao | G06F 1/3228 |
| | | | | 713/320 |
| 2007/0011421 | A1* | 1/2007 | Keller, Jr. | G06F 1/3225 |
| | | | | 711/165 |
| 2008/0005516 | A1* | 1/2008 | Meinschein | G06F 1/3225 |
| | | | | 711/165 |
| 2008/0147457 | A1* | 6/2008 | Rapp | G06Q 10/0637 |
| | | | | 705/7.36 |
| 2010/0011168 | A1* | 1/2010 | Ryu | G06F 12/0804 |
| | | | | 711/135 |
| 2010/0106901 | A1* | 4/2010 | Higeta | G11C 11/406 |
| | | | | 711/106 |
| 2011/0029797 | A1* | 2/2011 | Vaden | G06F 1/3225 |
| | | | | 713/324 |
| 2011/0066790 | A1* | 3/2011 | Mogul | G06F 12/023 |
| | | | | 711/103 |
| 2012/0030413 | A1 | 2/2012 | Miyagawa et al. | |
| 2012/0117304 | A1* | 5/2012 | Worthington | G06F 12/0223 |
| | | | | 711/103 |
| 2014/0298068 | A1* | 10/2014 | Kosonocky | G06F 1/3287 |
| | | | | 713/324 |

FOREIGN PATENT DOCUMENTS

| | | |
|---|---|---|
| JP | 2011-151354 A | 8/2011 |
| JP | 2012-033002 A | 2/2012 |
| JP | 2012-038233 A | 2/2012 |
| JP | 2012-064158 A | 3/2012 |

* cited by examiner

METHOD FOR DRIVING A SEMICONDUCTOR DEVICE INCLUDING DATA MIGRATION BETWEEN A VOLATILE MEMORY AND A NONVOLATILE MEMORY FOR POWER-SAVING

BACKGROUND OF THE INVENTION

1. Field of the Invention

The present invention relates to a semiconductor device and a driving method thereof. The present invention relates to a semiconductor device including a memory and a processor.

Note that in this specification, a semiconductor device means a circuit having a semiconductor element (e.g., a transistor or a diode) and a device having the circuit. The semiconductor device also means any device that can function by utilizing semiconductor characteristics. For example, an integrated circuit, a chip including an integrated circuit, a display device, a light-emitting device, a lighting device, and an electronic device are all semiconductor devices.

2. Description of the Related Art

Increase in performance of CPUs (central arithmetic processing device: central processing unit) leads to advance in multifunction and improvement in performance of electronic devices such as a personal computer and a portable information terminal. This results in larger capacity of a main memory in a CPU. A main memory with large capacity is usually a DRAM (dynamic random access memory) in consideration of performance and cost.

Since a DRAM is a volatile memory, power needs to be supplied to retain data and refresh operation needs to be performed at regular intervals to fill the memory cell with electric charge. Therefore, increase in capacity of the main memory causes problems of increase in power consumption. As a technique of saving power of the DRAM, the combination of a volatile memory and a nonvolatile memory is proposed (see Patent Documents 1 and 2).

A typical example of a nonvolatile memory is a flash memory. Other examples of a known nonvolatile memory are a magnetoresistive random access memory, a ferroelectric random access memory, and a phase change memory. It is known that a memory having a memory cell with the same structure as a DRAM and having a transistor including an oxide semiconductor layer in the memory cell functions as a nonvolatile memory (see Patent Document 3).

Patent Document

[Patent Document 1] Japanese Published Patent Application No. 2012-038233
[Patent Document 2] Japanese Published Patent Application No. 2008-287492
[Patent Document 3] Japanese Published Patent Application No. 2011-151354

SUMMARY OF THE INVENTION

It is one object of one mode of the present invention is to provide a semiconductor device in which power consumption of a volatile memory mainly used is low even when a processor typified by a CPU is in an operation state (working state). It is one object of one mode of the present invention is to provide a semiconductor device in which the power consumption can be lowered without reduction in processing speed of a processor in an operation state.

Note that a plurality of objects are described. Any of the descriptions does not preclude the existence of each object. One mode of the present invention does not necessarily achieve all the objects. Objects other than those listed above are apparent from the description of the specification, drawings, and claims, and also such objects could be one embodiment of the present invention.

One mode of the present invention is a semiconductor device which includes a processor executing an instruction and a main memory including a volatile memory and a nonvolatile memory. The main memory operates in a first operation mode in which access requirements of the processor is made to the volatile memory and in a second operation mode in which access requirements of the processor is made to the nonvolatile memory. Access requirements of the processor to the main memory and a capacity of used space of the volatile memory are monitored, and the operation mode of the main memory is changed on the basis of results of the monitoring. In the second operation mode, power supply voltage lower than that in the first operation mode is supplied to the volatile memory to hold data stored in the volatile memory.

According to one mode of the present invention, power consumption of a volatile memory which is mainly used can be reduced even when a processor typified by a CPU is in an operation state (working state).

DETAILED DESCRIPTION OF THE INVENTION

Figure 1:
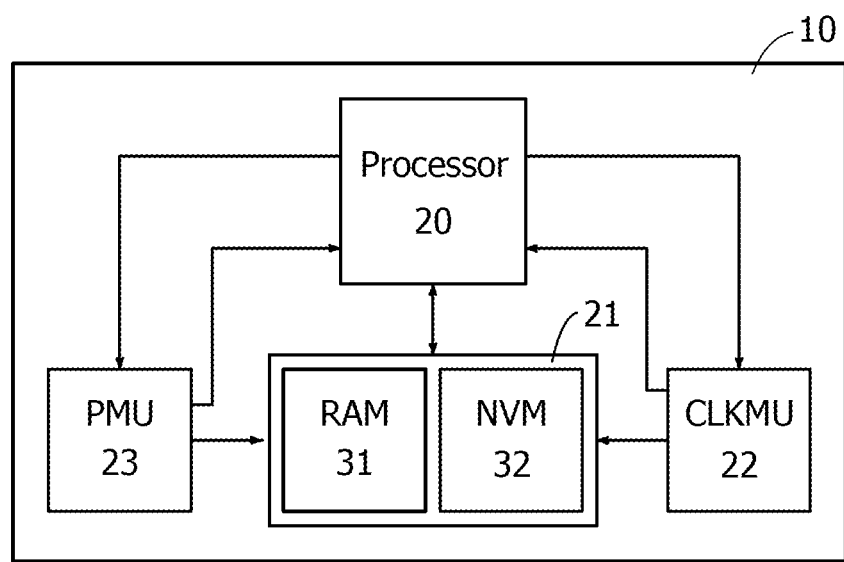
FIG. 1 is a block diagram illustrating one configuration example of a processing device.

Hereinafter, embodiments of the present invention will be described in detail with reference to the accompanying drawings. It will be readily appreciated by those skilled in the art that modes and details of the present invention can be changed in various ways without departing from the spirit and scope of the present invention. Therefore, the present invention should not be construed as being limited to the description of the embodiments below.

In the drawings used for the description of embodiments of the present invention, the same portions or portions having a similar function are denoted by the same reference numerals, and the repeated description thereof is omitted.

(Embodiment 1)

A semiconductor device of this embodiment will be described with reference to FIG. 1, FIG. 2, FIG. 3, FIG. 4, FIGS. 5A and 5B, and FIGS. 6A to 6C. In this embodiment, a processing device including a processor and a memory is described as the semiconductor device.

<Configuration Example of Processing Device 10>

FIG. 1 is a block diagram illustrating one example of the configuration of a processing device 10. The processing device 10 includes a processor 20 performing arithmetic processing, a main memory 21, a clock signal management unit (CLKMU) 22, and a power management unit (PMU) 23.

The processor 20 has an arithmetic function to execute instructions and a control function to control operation of a device in the processing device 10. A typical example of the processor 20 is a central processing unit (CPU). For another example, a graphics processing unit (GPU), or a circuit such as a digital signal processor (DSP), a custom LSI, or a field programmable gate array (FPGA) can also be used in the processor 20.

The CLKMU 22 manages supply of a clock signal used in the processing device 10 and has a function of generating a clock signal with a frequency suitable for operation of the processor 20 and the main memory 21.

The PMU 23 manages supply of power supply voltage to the processor 20, the main memory 21, and the CLKMU 22. For example, the PMU 23 determines the start or stop of supplying power supply voltage to the processor 20, the main memory 21, and the CLKMU 22, power supply voltage to be supplied, and the like in accordance with a control signal from the processor 20 and a control signal from the outside of the processing device 10.

The main memory 21 is a storage device which stores an instruction executed by the processor 20, data for executing the instruction, data processed by the processor 20, and the like. The main memory 21 includes a volatile memory (RAM) 31 and a nonvolatile memory (NVM) 32.

The processor 20 includes a cache memory. Note that the cache memory may be provided as a circuit separated from the processor but is preferably incorporated in the processor 20.

As the volatile memory 31, a random access memory is preferably used. An SRAM (static RAM), a DRAM (dynamic RAM), or the like can be used. Using a DRAM as the volatile memory 31 enables increase in capacity of the volatile memory at low cost in comparison with an SRAM. The volatile memory 31 preferably shows a response speed higher than that of the nonvolatile memory 32, and therefore, a DRAM is preferably used.

As the nonvolatile memory 32, a memory which has a longer period of retaining data without supply of power supply voltage than that of the volatile memory 31 is used. Further, the nonvolatile memory 32 is preferably a random access memory. As the nonvolatile memory 32, a flash memory, a resistance random access memory (also referred to as ReRAM), a phase change memory (also referred to as PRAM), a magnetoresistive random access memory (also referred to as MRAM), a ferroelectric random access memory (also referred to as FeRAM), or the like can be used. As the nonvolatile memory 32, an OS (oxide semiconductor) memory described in Embodiment 2 can be used. Note that the OS memory is a memory with a memory cell having a transistor, a channel of which is formed using an oxide semiconductor layer.

Hereinafter, the volatile memory 31 is also referred to as RAM 31 and the nonvolatile memory 32 is also referred to as NVM 32.

To the processing device 10, an external storage device, another processing device, and the like are connected. For an external storage device connected to the processing device 10, a storage device having a capacity larger than that of the main memory 21 is suitable. For example, an external storage device using a hard disk or a flash memory is suitable. The processor 20 does a swap out to back up data to the external storage device when available space of the main memory 21 is insufficient.

The main memory 21 includes a plurality of memory units employing different methods for retaining data and thus has a plurality of operation modes. The operation modes of the main memory 21 can be classified in consideration of a power supply voltage supply state and a memory which operates mainly. The operation modes of the main memory 21 correspond to operation modes of the volatile memory (RAM) 31 and the nonvolatile memory (NVM) 32.

The mode where power is supplied to the RAM 31 and the RAM 31 operates mainly is referred to as "normal mode". The mode where the RAM 31 operates with a power supply voltage lower than that of the "normal mode" is referred to as "power-saving mode". The mode where a power supply voltage is not supplied to the RAM 31 is referred to as "stop mode".

The operation mode of the main memory 21 is changed with a control signal input from the processor 20. The processor 20 has a function of monitoring access requirements for the main memory 21 of the processor 20 and obtains data such as kinds of access requirement (reading or writing), access times, access frequency, data transferring speed, the size of data to be written or read, or the like. The processor 20 has a function of monitoring the capacity of free space (or used space) of the main memory 21 (the volatile memory 31 and the nonvolatile memory 32). The processor 20 has a function of determining the operation mode of the main memory 21 on the basis of data obtained by access requirements and data such as available space of the main memory 21.

The processor 20 changes the operation mode of the main memory 21 on the basis of data obtained by monitoring access requirements to the main memory 21. An example of obtained data is access frequency. In high access frequency, an operation mode where the volatile memory 31 with high response speed operates mainly is selected. In low access frequency, an operation mode where the nonvolatile memory 32 operates mainly is selected.

Three examples of operation of the processing device 10 are described with reference to flow charts of FIG. 2, FIG. 3, and FIG. 4. In these operation examples, the RAM 31 or the NVM 32 is selected as a memory operating mainly depending on the frequency of accessing the main memory 21 from the processor 20. As described below, such control enables an appropriate memory (the RAM 31 or the NVM 32) to operate mainly without decrease in processing speed of the processor 20.

<Operation Example 1 of Processing Device>

Figure 2:
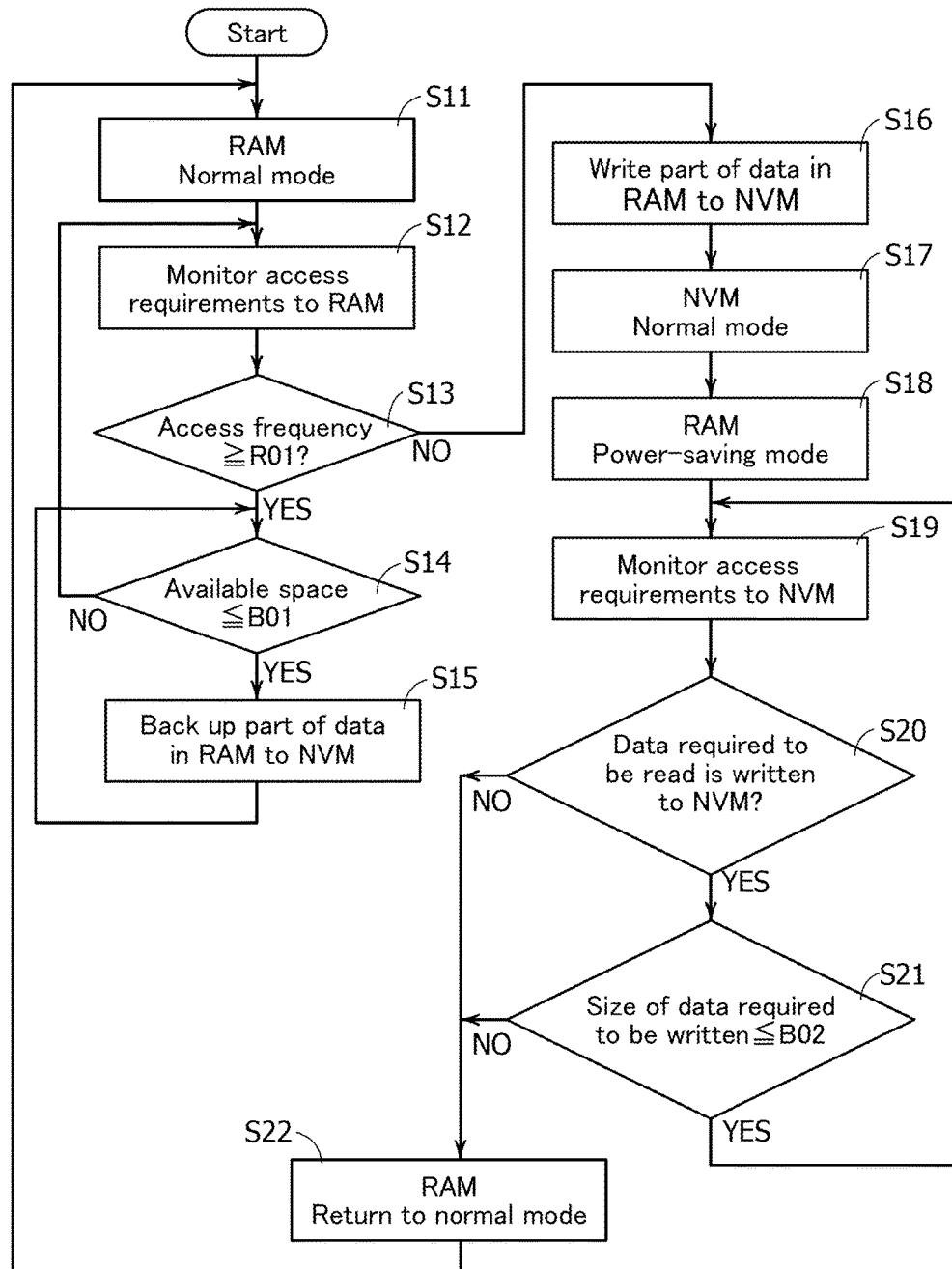
FIG. 2 is a flow chart showing one example of a driving method of a processing device.

FIG. 2 shows an operation example of the processing device 10 in the case where the processor 20 is in a normal operation state (working state), for example, the processor 20 executes arithmetic processing. Specifically, FIG. 2 shows a method for controlling the main memory 21 by the processor 20.

In Operation Example 1, the RAM 31 or the NVM 32 is selected as a memory operating mainly depending on the frequency of accessing the main memory 21 from the processor 20. When the RAM 31 is in the normal mode (operates mainly), the NVM 32 operates as a backup memory of the RAM 31. Reduced available space of the RAM 31 causes backup of part of data stored in the RAM 31 to the NVM 32.

(RAM: Normal Mode)

First, the processor 20 makes the RAM 31 operate in the normal mode (Step S11). The processor 20 accesses the RAM 31 operating mainly to read an instruction and data needed for executing the instruction. The processor 20 writes the results of executing the instruction to the RAM 31, as necessary.

While the RAM 31 operates in the normal mode, the processor 20 monitors access requirements to the RAM 31 to measure the frequency of accessing the RAM 31 (Step S12) and then determines whether the frequency of accessing the RAM 31 is high (Step S13). The processor 20 controls the operation mode of the main memory 21. That is, the processor 20 does not change the operation mode of the main memory 21 in high frequency of accessing the RAM 31 and changes the operation mode of the main memory 21 to make the NVM 32 operate mainly.

For example, in Step S13, the processor 20 determines whether the access frequency is not less than (or exceeds) a set value R01. In the case where the access frequency is not less than the set value R01 (or exceeds R01), the processor 20 does not change the operation mode of the main memory 21 and accesses the RAM 31 operating mainly.

Access frequency corresponds to, for example, access times per unit time and time intervals from an access requirement from the processor 20 to the next access requirements. In the case of monitoring access times per unit time as the access frequency, the set value R01 is access times. For example, the processor 20 counts access times every predetermined period. When the access times become larger than or equal to (or exceeds) set times during the count period, the processor 20 determines that access frequency is high. In the case of monitoring period from an access requirement to the next access requirement as access frequency, the set value R01 is time. When an access requirement occurs before a set time is elapsed (or the end of the period) from the previous access requirements, the processor 20 determines that access frequency is high.

To measure the frequency of access the RAM 31, the processor 20 may monitor one or both of read requirements and write requirements to the RAM 31. Further, the set value R01 is not constant, for example, may depend on an operation environment (for example, temperature) of the processor 20, the RAM 31, and the like.

In the case where the RAM 31 is a DRAM, for example, access frequency is regarded as time intervals between access requirements, and refresh intervals which are set as the specification of the DRAM can be used as the set value R01. In this case, when the interval between access requirements to the DRAM is shorter than its refresh interval, the DRAM operates in the normal mode. On the other hand, when the interval between access requirements is longer, the DRAM is switched to the power-saving mode. Read and write requirements are input at intervals shorter than refresh intervals by such control while the DRAM operates mainly; accordingly, refresh times can be smaller than the times required in specifications. Therefore, power consumption of the DRAM can be reduced; as a result, power of the entire processing device 10 can be saved.

The NVM 32 has a processing speed lower than that of the RAM 31 but has an advantage of not requiring voltage to retain data. To effectively use the NVM 32, the NVM 32 is used as a swap area of the RAM 31 here while the RAM 31 operates in the normal mode, to compensate shortage in available space of the RAM 31. Steps S14 and S15 show processing of the processor 20 for the effective use of the NVM 32. Steps S14 and S15 can prevent the processing of the processor 20 from being suspended by shortage of capacitance of the RAM 31.

When available space exceeds (or is larger than or equal to) a set value B01, the process goes back to Step S12. When the available space is smaller than or equal to (or below) the set value B01, the processor 20 backs up part of data in the RAM 31 to the NVM 32 (Step S15). For example, when the available space of the RAM 31 is less than or equal to 10% of the capacitance of the RAM 31, Step S15 is carried out. Steps S14 and S15 are repeated to make the available space of the RAM 31 exceed the set value B01 (or larger than or equal to the set value B01).

Note that the set value B01 may be not constant, for example, depend on an operation environment (for example, temperature) of the processor 20, the RAM 31, and the like.

In Step S15, access history, access times, or the like may be used as a standard of selecting data backed up from the RAM 31 to the NVM 32. Data is written to the NVM 32 in the order of their occurrence in access history. Alternatively, data, access times of which are smaller than or equal to predetermined times, is written to the NVM 32.

(NVM: Normal Mode)

When the processor 20 determines that the frequency of accessing the RAM 31 is less than the set value R01 (or less than or equal to) in Step S13, the processor 20 executes processing of switching a mainly used memory from the RAM 31 to the NVM 32.

In Step S16, as preparation for making the NVM 32 operate in the normal mode, the processor 20 controls the main memory 21 to write part of data held in the RAM 31 to the NVM 32. In Step S16, an instruction being executed by the processor 20, data needed to execute the instruction, and the like are written to the NVM 32. Further, data which is frequently accessed, data which is latest in access history, and the like may be written to the NVM 32.

After Step S16, the processor 20 makes the NVM 32 operate in the normal mode (Step S17) and makes the RAM 31 operate in the power-saving mode (Step S18).

In Step S18, the processor 20 controls the clock signal management unit 22 to output a clock signal with a frequency lower than that in the normal mode of the RAM 31 to the RAM 31. The processor 20 controls the power management unit 23 to supply a power supply voltage lower than that in the normal mode to the RAM 31. In the power-saving mode, the RAM 31 which is a volatile memory performs only operation needed for data retention, and a clock signal and power supply voltage needed for the operation is input to the RAM 31. For example, in the case where the RAM 31 is a DRAM, the DRAM is regularly refreshed in Step S18.

The processor 20 monitors access requirements to the NVM 32 (Step S19) while the RAM 31 is in the power-saving mode. Then, the processor 20 determines whether the RAM 31 is made to return to the normal mode on the basis of the monitoring result in Step S19 (Steps S20 and S21).

In Step S20, the processor 20 determines whether data required to be read is written to the NVM 32. If the processor 20 determines that the data is not written to the NVM 32, the RAM 31 is made to return to the normal mode (Step S22). If the processor 20 determines that the data is written to the NVM 32, Step S21 is carried out.

In Step S21, the processor 20 determines whether the RAM 31 is made to return to the normal mode, on the basis of the results of monitoring writing requirements. Here, the size of data required to be written is obtained. If the size exceeds (or is larger than or equal to) a set value B02, the RAM 31 is made to return to the normal mode (Step S22). If the size is less than or equal to (or below) the set value B02, the process returns to Step S19 and the NVM 32 is made to operate the normal mode.

For example, the set value B02 can be determined by a nominal value of data transferring speed in writing data to the NVM 32. In general, a data transferring speed of a nonvolatile memory in writing data is lower than that of a volatile memory. Therefore, if data with large capacity is written to the NVM 32, the throughput of the processor 20 is reduced. By carrying out Step S21, data with large capacity is written to the main memory 21 when the RAM 31 is in the normal mode; accordingly, reduction in throughput of the processor 20 can be avoided.

The data which is used for determining whether the RAM 31 is made to return to the normal mode does not necessarily depend on the size of written data. For example, in Step S19, the data transferring speed in read and/or write processing to the NVM 32 is measured. It is also possible that the RAM 31 returns to the normal mode if the measured value exceeds (or larger than or equal to) a certain value.

The RAM 31 may return to the normal mode in the case where the available space of the NVM 32 becomes small and times of swap out in which data is backed up to an external storage device connected to the processing device 10 are larger than or equal to certain times.

Step S22 is a step for making the RAM 31 return to the normal mode. The processor 20 controls the clock signal management unit 22 and the power management unit 23 to input, to the RAM 31, a clock signal and a power supply voltage which are those in the normal mode. The processor 20 writes data written to the NVM 32 to the RAM 31 while making the NVM 32 operate in the normal mode (in carrying out Steps S19 to S21).

The processor 20 continues the processing in which the RAM 31 is mainly used (Step S11).

As described above, in Operation Example 1, the RAM 31 is in the power-saving mode when the frequency of accessing the main memory 21 of the processor 20 is low. The NVM 32 which has a low processing speed but is nonvolatile can operate mainly; therefore, reduction in the throughput of the processor 20 can be suppressed, and power consumption of the main memory 21 can be reduced.

<Operation Example 2 of Processing Device>

The capacity of the NVM 32 is made to be larger than the RAM 31, so that the main memory 21 can be in a stop mode in which power supply to the RAM 31 is stopped, while the NVM 32 operates in the normal mode. An example of driving the processing device 10 so that the main memory 21 operates in the above manner will be described below with reference to the flow charts of FIG. 3 and FIG. 4.

Figure 3:
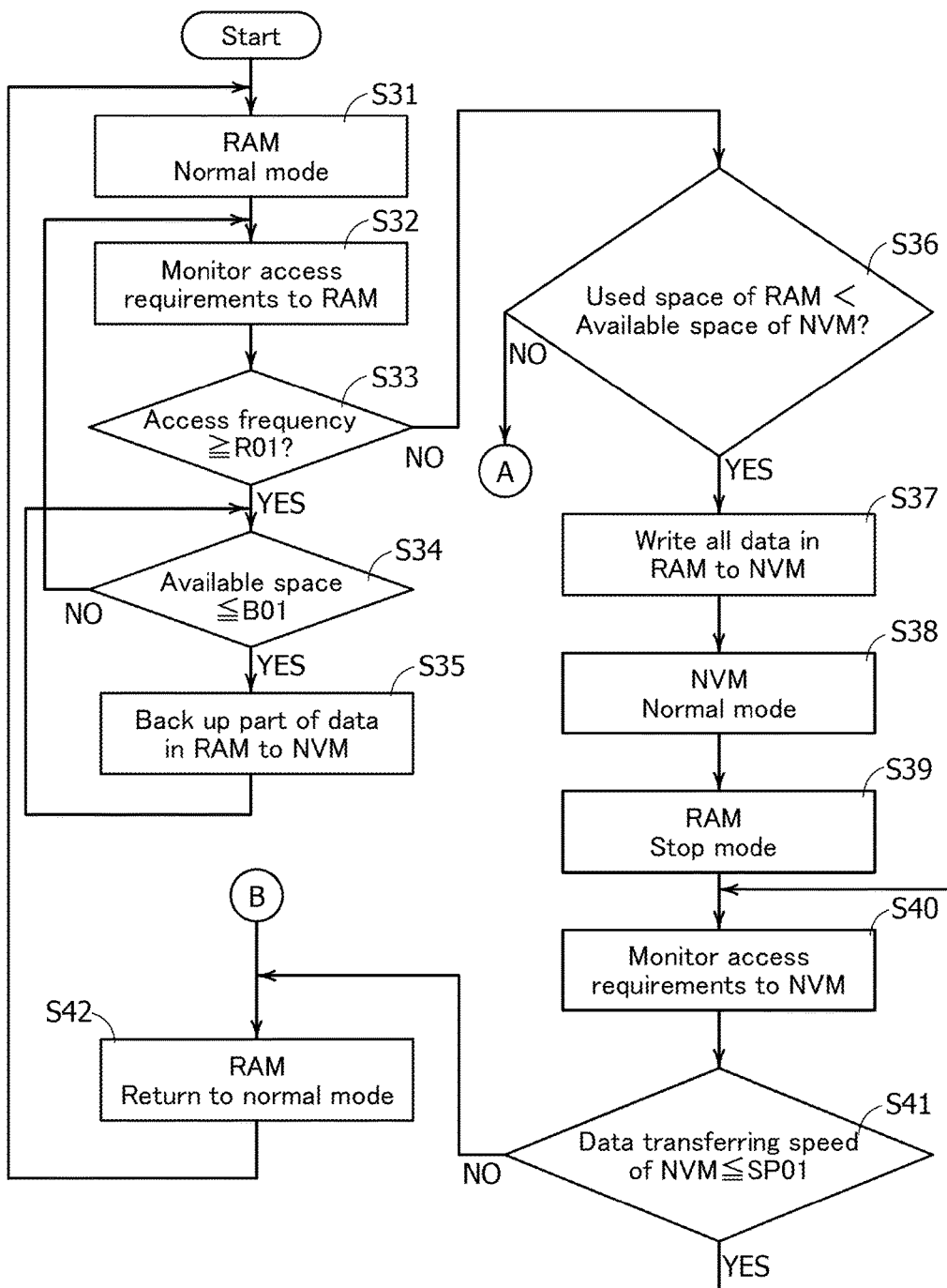
FIG. 3 is a flow chart showing one example of a driving method of a processing device.
Figure 4:
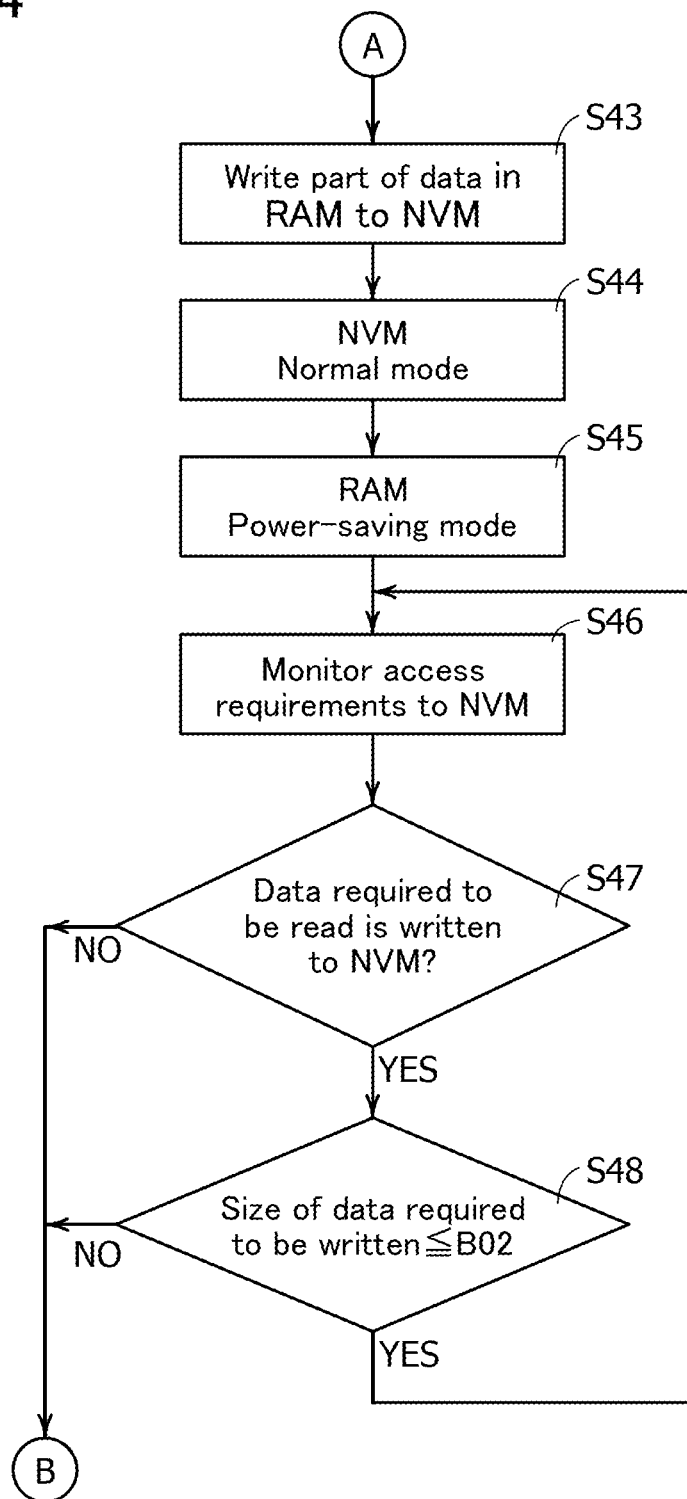
FIG. 4 is a flow chart showing one example of a driving method of a processing device.

The flow shown in FIG. 3 and FIG. 4, as in FIG. 2, also shows the processing of the processor 20 in the state where the processor 20 is in a normal operation state (working state).

(RAM: Normal Mode)

The process shown in FIG. 3 (Steps S31 to S35) is the processing of the processor 20 to make the RAM 31 operate in the normal mode and is the processing similar to that in Steps S11 to S15 of Operation Example 1. Note that since the NVM 32 has sufficient capacity, the set value B01 in Step S34 can be higher than the set value B01 in Step S14 in Operation Example 1. For example, the set value B01 is set to 30% of the capacity of the RAM 31. If the available space of the RAM 31 is below (or less than or equal to) 30% of its capacity in Step S34, Step S35 is carried out.

If it is determined in Step S33 that the frequency of access the RAM 31 in the processor 20 is below (or less than or equal to) the set value R01, Step S36 is carried out to make the NVM 32 be in the normal mode. In Operation Example 2, the RAM 31 is in the stop mode or a suspension mode in a period during which the NVM 32 is in the normal mode. Step S36 is a step for determining the mode of the RAM 31.

In Step S36, the capacity of the used space of the RAM 31 is used for the determination. If the capacity of the used space of the RAM 31 is less than or equal to (preferably, as shown in FIG. 3, below) that of the available space the NVM 32, Steps S37 to S39 are carried out to make the RAM 31 be in the stop mode. Otherwise, Steps S43 to S45 (FIG. 4) are carried out to make the RAM 31 be in the power-saving mode.

(RAM: Stop Mode)

To make the RAM 31 be in the stop mode, the processor 20 controls the main memory 21 to write all of the data stored in the RAM 31 to the NVM 32 (Step S37). The processor 20 makes the NVM 32 operate in the normal mode (Step S38) and makes the RAM 31 be in the stop mode (Step S39). In Step S39, the processor 20 controls the clock signal management unit 22 and the power management unit 23 to stop input of a clock signal and supply of a power supply voltage to the RAM 31.

As in Operation Example 1, while the RAM 31 is in the power-saving mode, the processor 20 monitors access requirements to the NVM 32 (Step S40) and determines whether the RAM 31 returns to the normal mode on the basis of the monitoring results in Step S40 (Step S41).

Step S40 is a step similar to Step S19 in Operation Example 1. Here, as data used for determination in Step S41, the data transferring speed of the NVM 32 is measured. Data transferring speed may be measured in one or both of data writing processing and data reading processing. Here, data transferring speed in data writing processing is measured.

If the data transferring speed in the data writing processing is lower than or equal to (or below) a set value SP01 in Step S41, the process returns to Step S40 and operation in the normal mode is continued. If the data transferring speed exceeds (or is higher than or equal to) the set value SP01, the RAM 31 is made to return to the normal mode (Step S42).

Note that the set value SP01 may be not constant, for example, depend on an operation environment (for example, temperature) of the processor 20, the NVM 32, and the like.

(RAM: Power-saving Mode)

If it is determined in Step S36 that the available space of the NVM 32 is insufficient, Steps S43 to S48 (FIG. 4) are carried out.

Steps S43 to S46 are carried out as in Steps S16 to S19 in Operation Example 1. In Steps S47 and S48, whether the RAM 31 returns to the normal mode is determined on the basis of the monitoring results in Step S46.

Step S47 is a step similar to Step S20 in Operation Example 1. In Step S47, the processor 20 determines whether data required to be read is written to the NVM 32. If the processor 20 determines that the data is not written to the NVM 32, the RAM 31 is made to return to the normal mode (Step S42). If the processor 20 determines that the data is written to the NVM 32, another determination processing is carried out (Step S48).

Step S48 is a step similar to Step S21 in Operation Example 1. If the size of data required to be written is lower than or equal to (or below) the set value B02, the process returns to Step S46 and the NVM 32 continues to operate in the normal mode. If the size of the data exceeds (or larger than or equal to) the set value B02, the RAM 31 returns to the normal mode (Step S42).

Note that another determination processing like that in Step S41 can be added after Step S48.

Further, in Operation Example 2, while the NVM 32 operates in the normal mode, the RAM 31 may return to the normal mode in the case where the available space of the NVM 32 becomes small and times of swap out in which data is backed up to an external storage device connected to the processing device 10 are larger than or equal to a certain times.

<Operation Example 3 of Processing Device>

In Operation Example 2, if it is determined in Step S36 that the available space of the NVM 32 is insufficient, the RAM 31 is made to be in the power-saving mode while the NVM 32 operates in the normal mode. On the other hand, in Operation Example 3, the RAM 31 is made to be in the stop mode to further reduce power consumption of the processing device 10.

To carry out the process, the data which cannot be backed up to the NVM 32 in Step S43 is backed up to an external storage device connected to the processing device 10. After the completion of the backup processing, either Step S40 or Step S47 may be carried out.

Accordingly, as in Operation Examples 2 or 3, when the frequency of accessing the main memory 21 in the processor 20 is low, the RAM 31 is made to be the power-saving mode or the stop mode. Thus, the NVM 32 which has a low processing speed but is nonvolatile can operate mainly. As a result, reduction in throughput of the processor 20 can be suppressed and power consumption of the main memory 21 can be reduced.

This embodiment can be implemented in appropriate combination with any of the structures described in the other embodiments.

(Embodiment 2)

In this embodiment, a configuration example of the nonvolatile memory 32 (the NVM 32) will be described.

As described in Embodiment 1, a flash memory, a resistance random access memory (ReRAM), a phase change memory (PRAM), a magnetoresistive random access memory (MRAM), a ferroelectric random access memory (FeRAM), or the like can be used as the NVM 32. In this embodiment, an OS (oxide semiconductor) memory which can be built with a manufacturing technique of a transistor will be described as the NVM 32.

Here, the OS memory is a memory in which a transistor having an oxide semiconductor layer (hereinafter, also referred to as OS transistor) is formed in a memory cell. The OS transistor has a channel including an oxide semiconductor and thus has very low leakage current. The OS transistor does not serve as a leakage path of electric charge from a node holding data (voltage); therefore, the memory cell can be nonvolatile.

When such a transistor as described above is used, it is significantly effective to reduce impurities such as an alkali metal, hydrogen, and water as much as possible and supply oxygen to reduce oxygen vacancies as much as possible in an oxide semiconductor where a channel is formed, in order to reduce the leakage current of the OS transistor. For example, the amount of hydrogen that is regarded as a donor impurity in the channel formation region is preferably reduced to lower than or equal to $1\times10^{19}/cm^3$, further preferably lower than or equal to $1\times10^{18}/cm^3$ by secondary ion mass spectrometry (SIMS). The leakage current (off-state current) per micrometer of channel width of the OS transistor in an off state at 25° C. is preferably lower than or equal to $1\times10^{-19}$ A (100 zA), more preferably lower than or equal to $1\times10^{-22}$ A (100 yA). It is preferable that the off-state current of the transistor, which serves as a leakage path of electric charge, be as low as possible; the lower limit of the off-state current of the OS transistor is estimated at about $1\times10^{-30}$ A/μm.

The oxide semiconductor layer of the OS transistor may be formed using In oxide, Zn oxide, In—Zn oxide, or In—Ga—Zn oxide, for example.

In the following description, three configuration examples of the OS memory capable of being used as the NVM 32 will be described with reference to FIGS. 5A and 5B and FIGS. 6A to 6C. Note that in this specification, the OS transistor is an n-channel transistor.

As described above, an oxide semiconductor transistor has excellent electric characteristics of an extremely small off-state current. Two kinds of OS memory utilizing such electric characteristics of the OS transistor will be described. Here, the memories are referred to as "DOSRAM" and "NOSRAM".

"DOSRAM" stands for a dynamic oxide semiconductor random access memory "NOSRAM" stands for a non-volatile oxide semiconductor random access memory.

<DOSRAM>

Figure 5A:
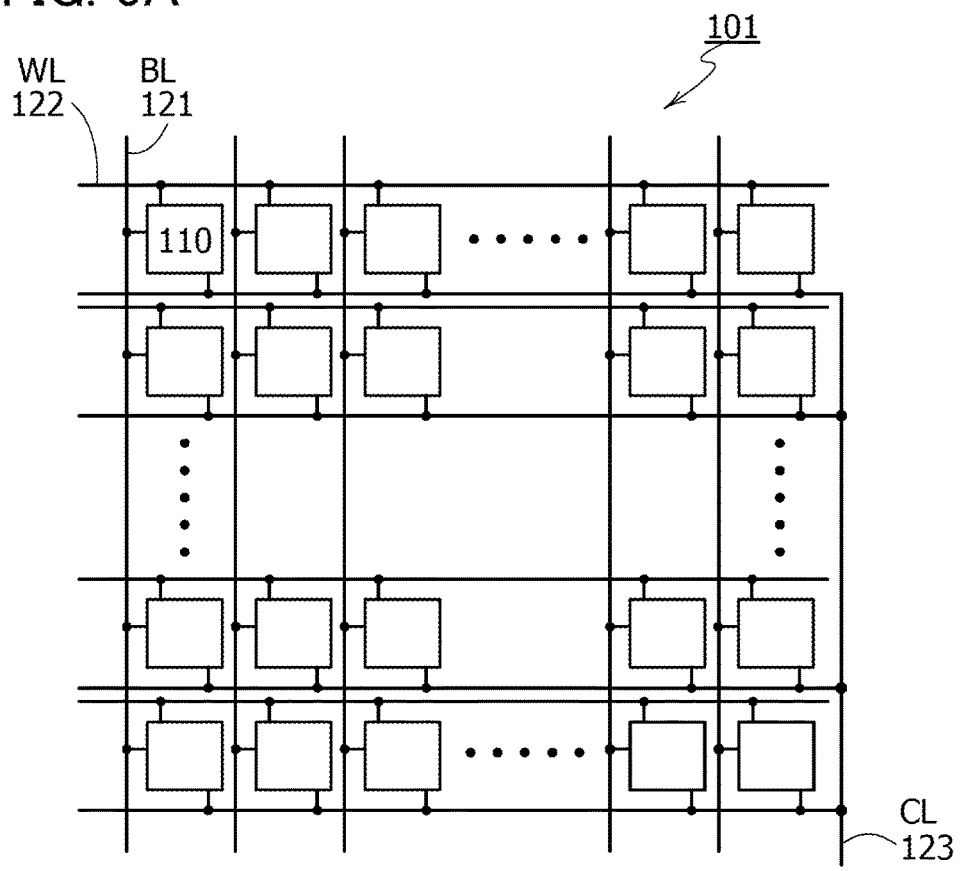
FIG. 5A is a block diagram illustrating one configuration example of a memory cell array of an OS memory (DOSRAM) and FIG. 5B is a circuit diagram illustrating one configuration example of a memory cell of an OS memory (DOSRAM).
Figure 5B:
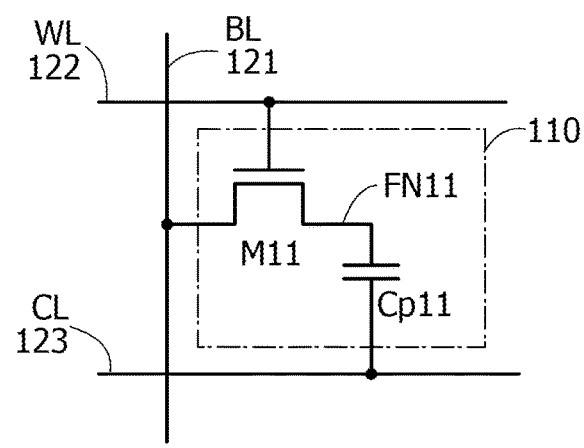

FIG. 5A is a block diagram illustrating a configuration example of a memory cell array in a DOSRAM. FIG. 5B is a circuit diagram illustrating a configuration example of a memory cell.

As illustrated in FIG. 5A, a memory cell array 101 includes the memory cell 110, a bit line (BL) 121, a word line (WL) 122, and a power supply line (CL) 123. A plurality of memory cells 110 are provided in array. The memory cells 110 in one column are connected to the BL 121 in the corresponding column. The memory cells 110 in one row is connected to the WL 122 in the corresponding row. The BLs 121 are connected to a column selection driver. The WLs 122 are connected to a row selection driver. All of the memory cells 110 are connected to the CL 123. A certain voltage is supplied to the CL 123.

As illustrated in FIG. 5B, the memory cell 110 includes a transistor M11 and a capacitor Cp11.

A gate of the transistor M11 is connected to the WL 122. A source of the transistor M11 is connected to the BL 121. A drain of the transistor M11 is connected to one terminal of the capacitor Cp11. The capacitor Cp11 is provided between the drain of the transistor M11 and the CL 123 and is connected to them. Accordingly, the memory cell 110 has a configuration similar to that of a memory cell of a general DRAM except that the transistor M11 is an OS transistor. Further, the memory cell 110 operates in a manner similar to a memory cell of a general DRAM.

The leakage current of the transistor M11 generally leads to reduction in voltage held in the capacitor Cp11 with time. The off-state current of the transistor M11 is extremely low, and thus, a data retention period can be extremely long. For example, the use of the transistor M11 which has an off-state current of $1\times10^{-21}$ A to $1\times10^{-25}$ A enables data retention for several days to several decades without supply of power.

<NOSRAM>

Figure 6A:
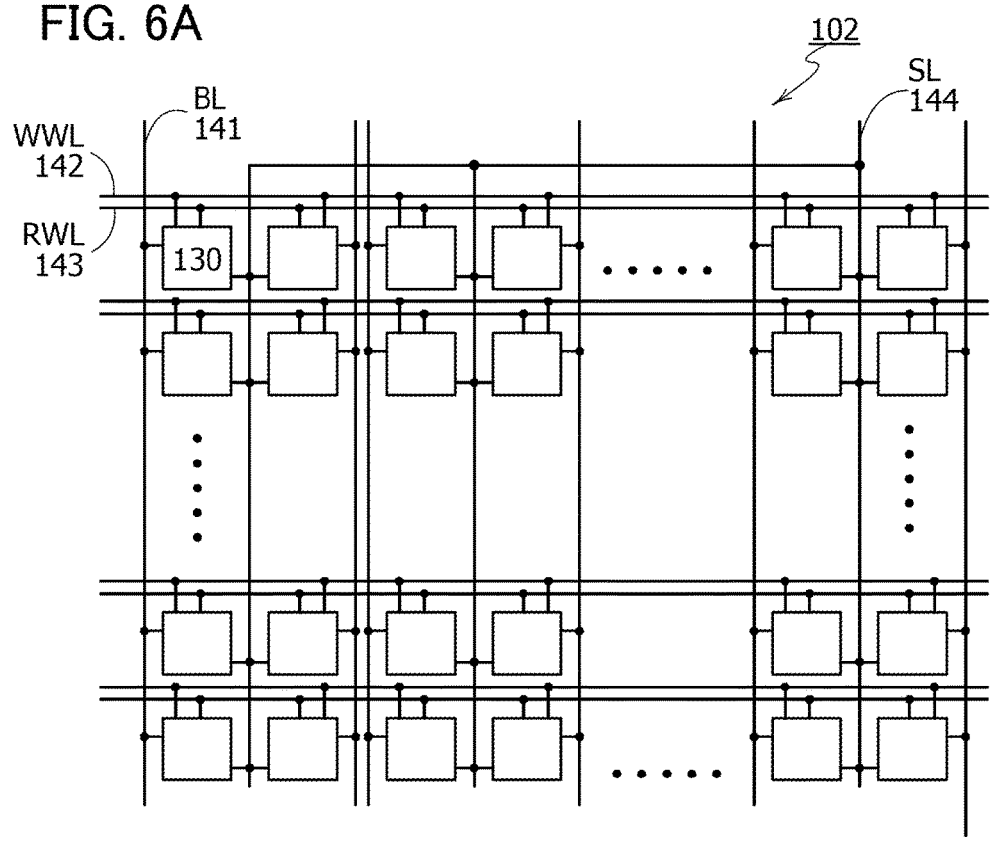
FIG. 6A is a block diagram of one configuration example illustrating a memory cell array of an OS memory (DOSRAM) and FIGS. 6B and 6C are circuit diagrams each illustrating one configuration example of a memory cell of an OS memory (DOSRAM).
Figure 6B:
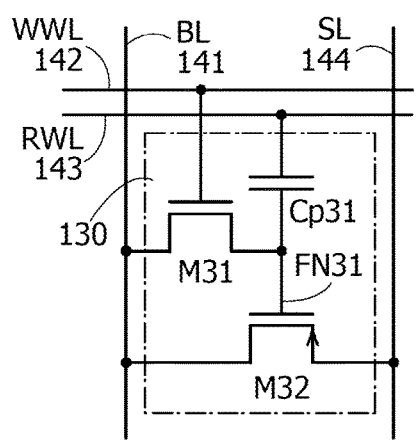
Figure 6C:
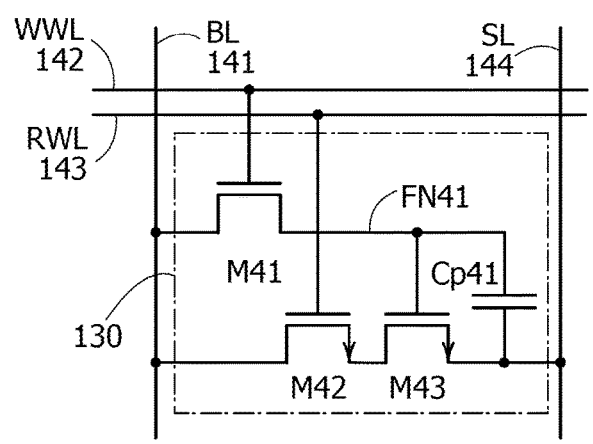

FIG. 6A is a block diagram of a configuration example of a memory cell array of NOSRAM. FIGS. 6B and 6C are circuit diagrams illustrating configuration examples of a memory cell.

As illustrated in FIG. 6A, a memory cell array 102 includes a memory cell 130, a bit line (BL) 141, a writing word line (WWL) 142, a reading word line (RWL) 143, and a power supply line (SL) 144. A plurality of memory cells 130 are provided in array. The memory cells 130 in one column are connected to the BL 141 in a corresponding column. The memory cells 130 in one row are connected to the WWL 142 and the RWL 143 in a corresponding row. All of the memory cells 130 are connected to the SL 144.

The BL 141 and the SL 144 are connected to a column selection driver. The WWL 142 and the RWL 143 are connected to a row selection driver. The output of the BL 141 is connected to a reading circuit including an analog-digital conversion device and the like.

In a configuration example illustrated in FIG. 6B, the memory cell 130 includes a transistor M31, a transistor M32, and a capacitor Cp31.

The capacitor Cp31 is connected to the RWL 143 and a gate of the transistor M32 (a node FN31) and provided therebetween. A gate of the transistor M31 is connected to the WWL 142. A source of the transistor M31 is connected to the BL 141. A drain of the transistor M31 is connected to the node FN31. A source of the transistor M32 is connected to the SL 144. A drain of the transistor M32 is connected to the BL 141.

The transistor M31 is an OS transistor. The transistor M32 is a transistor having a channel formed of single crystal silicon and a p-channel transistor here. The transistor M32 functions as a switch for connecting the node FN31 to the BL 141 in reading data.

Note that a transistor having a channel formed of silicon, such as the transistor M32, is referred to as Si transistor.

In writing data, the transistor M31 functions as a switch for connecting the node FN31 to the BL 141. When data is written to the memory cell 130, a voltage at a high level is supplied to the WWL 142 to turn on the transistor M31. The voltage of the RWL 143 is at a low level. The voltage of the node FN31 corresponds to the voltage of the BL 141. A voltage corresponding to one data in multilevel data is input to the bit line BL, whereby the memory cells 130 can hold multilevel data.

The leakage current of the transistor M31 generally leads to reduction in voltage held in the node FN31 with time. The off-state current of the transistor M31 is extremely low, and thus, a data retention period can be extremely long.

In reading data, the voltage of the RWL 143 is set to a low level to turn on the transistor M32. A current corresponding to a voltage of the node FN31 in writing data flows between the source and drain of the transistor M32. The current causes charge and discharge of the BL 141. By the sampling of the voltage of the BL 141, data held in the memory cell 130 can be read.

FIG. 6C is a circuit diagram of another configuration example of the memory cell 130. The memory cell 130 illustrated in FIG. 6C includes three transistors M41, M42, and M43 and a capacitor Cp41. The transistor M41 is an OS transistor. The transistors M42 and M43 are n-channel Si transistors.

Read operation and write operation will be described below. To write data to the memory cell 130, the voltage of the RWL 143 is set to a low level and the voltage of the WWL 142 is set to a high level, whereby only transistor M41 is turned on. Electric charge corresponding to the voltage of the BL 141 is accumulated in the node FN41. After the voltage of the WWL 142 is kept at a high level for a certain period, the potential is set back to a low level, whereby the write operation is finished.

In the case where data is read from the memory cell 130, the voltage of the BL 141 is set to a high level (precharge). The voltage of the WWL 142 is set to a low level and the voltage of the RWL 143 is set to a high level, whereby the transistor M42 is turned on. Since current flows between the source and drain of the transistor M43 depending on the voltage of the node FN41, the BL 141 is discharged (or charged). By sampling of the voltage of the BL 141, data held in the memory cell 130 can be read.

A die of an OS memory will be described below with reference to FIG. 7. Here, a structure of the die is described using a DOSRAM in FIGS. 5A and 5B as an example.

Figure 7:
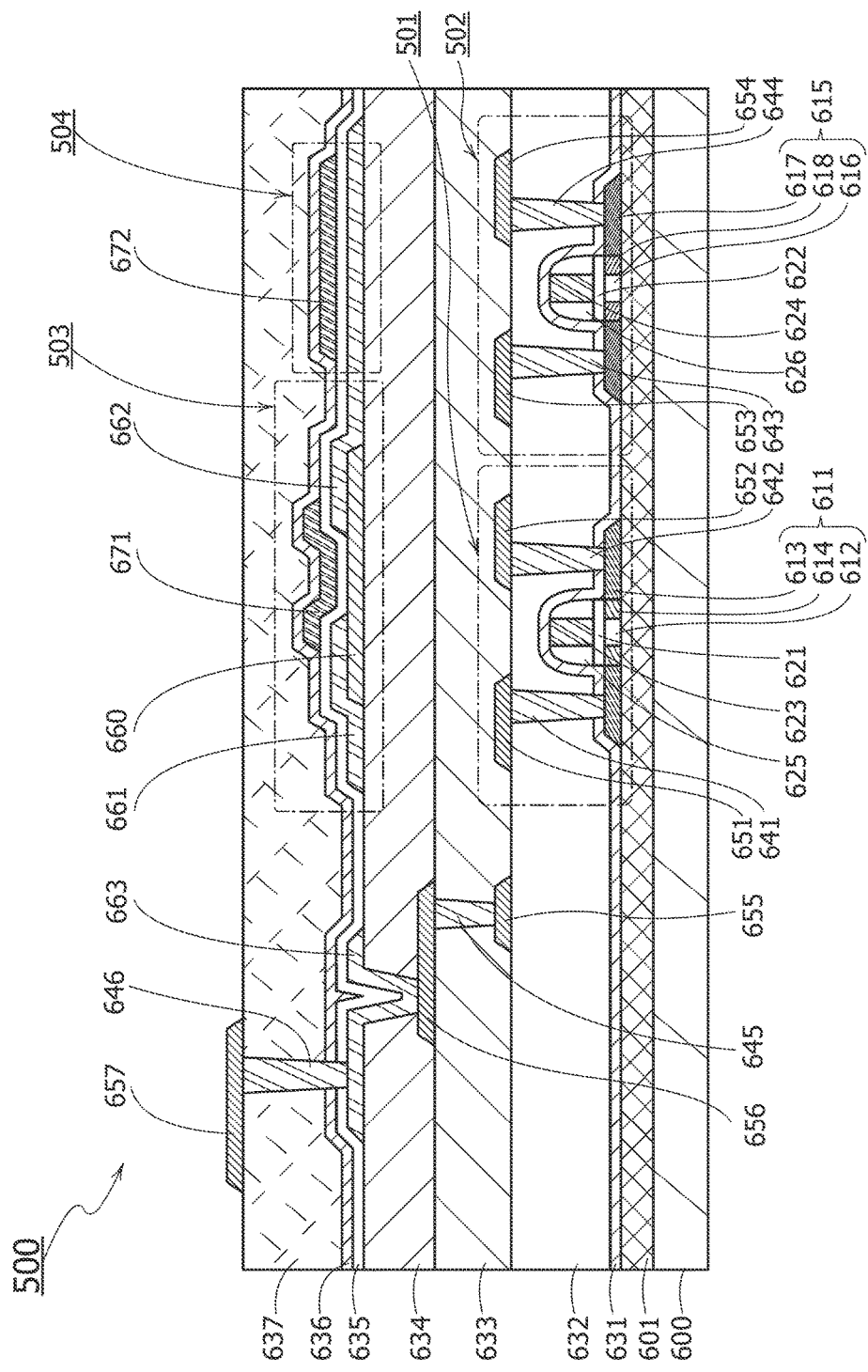
FIG. 7 is a cross-sectional view illustrating one structural example of an OS memory die.

FIG. 7 is a cross-sectional view of one example of a layered structure of a DOSRAM die. Note that FIG. 7 is not a cross-sectional view of the die taken along a specific line but a view for illustrating a layered structure of the die. FIG. 7 shows a Si transistor 501, a Si transistor 502, an OS transistor 503, and a capacitor 504 as elements of the DOSRAM.

The Si transistors 501 and 502 are transistors included in circuits (e.g., a row selection driver and a column selection driver) except for the memory cell array 101 in the OS memory (DOSRAM). Here, the Si transistor 501 is a p-channel transistor. The Si transistor 502 is an n-channel transistor. The OS transistor 503 and the capacitor 504 correspond to the transistor M11 and the capacitor Cp11, respectively in the memory cell 110.

As shown in FIG. 7, the memory cell array 101 is stacked over circuits such as the row selection driver and the column selection driver, whereby the size of a die 500 can be reduced.

The Si transistors 501 and 502 are formed using an SOI substrate having a single crystal Si layer. In FIG. 7, 600 denotes a single crystal Si wafer which is a support substrate of the SOI substrate; and 601, an insulating layer of the SOI substrate including an embedded oxide layer. Note that the Si transistors 501 and 502 may be formed using a bulk single crystal Si wafer.

The Si transistor 501 includes a single crystal Si layer 611, a gate insulating layer 621, and a gate electrode 623. In the single crystal Si layer 611, a channel formation region 612, a pair of p-type impurity regions 613, and a pair of p-type lightly doped regions 614 are formed. Sidewall 625 is formed on the gate electrode 623.

The Si transistor 502 has a structure similar to that of the Si transistor 501. The Si transistor 502 includes a single crystal Si layer 615, a gate insulating layer 622, and a gate electrode 624. In the single crystal Si layer 615, a channel formation region 616, a pair of n-type impurity regions 617, and a pair of n-type lightly doped regions 618 are formed. Sidewall 626 is formed on the gate electrode 624.

Note that depending on a circuit configuration, the gate electrode 623 can be provided as a wiring. This point is similar to another electrode.

An insulating layer 631 is formed to cover the Si transistors 501 and 502. An insulating layer 632 is formed to cover the insulating layer 631. Electrodes 651, 652, 653, 654, and 655 are formed over the insulating layer 632. Openings reaching the p-type impurity regions 613 and the n-type impurity regions 617 are formed in the insulating layer 631 and the insulating layer 632. Plugs 641, 642, 643, and 644 are formed in these openings. The electrodes 651 and 652 are connected to the Si transistor 501 via the plugs 641 and 642, respectively. The electrodes 653 and 654 are connected to the Si transistor 502 via the plugs 643 and 644, respectively.

An insulating layer 633 is formed to cover the insulating layer 632. An electrode 656 is formed over the insulating layer 633. An opening reaching the electrode 655 is formed in the insulating layer 633. A plug 645 is formed in the opening. The electrode 655 and the electrode 656 are connected via the plug 645.

Note that a wiring functioning as a back gate of the OS transistor 503 may be formed in the same layer as the electrode 656.

An insulating layer 634 is formed to cover the insulating layer 633. The OS transistor 503 and the capacitor 504 are formed over the insulating layer 634.

The OS transistor 503 includes an oxide semiconductor layer (OS layer) 660, a wiring 661, an electrode 662, an insulating layer 635, and a wiring 671. The wiring 661 serves as the BL 121. The wiring 671 serves as a gate electrode of the OS transistor 503 and the WL 122. The insulating layer 635 serves as a gate insulating layer.

The capacitor 504 includes the electrode 662, a wiring 672, and the insulating layer 635. The wiring 672 serves as the CL 123.

An electrode 663 is formed over the insulating layer 634. An opening reaching the electrode 656 is formed in the insulating layer 634. The electrode 663 is connected to the electrode 656 in the opening. The opening is formed before a conductive film is formed to be the wiring and the electrodes (661, 662, and 663).

An insulating layer 636 is formed to cover the OS transistor 503 and the capacitor 504. An insulating layer 637 is formed to cover the insulating layer 636. An electrode 657 is formed over the insulating layer 637. An opening reaching the electrode 663 is formed in the insulating layers 635 to 637. A plug 646 is formed in the opening. The electrodes 663 and 657 are connected via the plug 646. The electrode 657 serves as extraction terminal of the die 500 (OS memory).

The insulating layers 631 to 637 can be formed with a single layer of an insulating film or a multilayer of two or more insulating films. Examples of the insulating film used for the insulating layers 631 to 637 include an aluminum oxide film, a magnesium oxide film, a silicon oxide film, a silicon oxynitride film, a silicon nitride oxide film, a silicon nitride film, a gallium oxide film, a germanium oxide film, a yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method. As a film to be the insulating layers 631 to 637, a resin film of polyimide, acrylic resin, or the like can be formed.

Note that in this specification, an oxynitride refers to a substance that contains more oxygen than nitrogen, and a nitride oxide refers to a substance that contains more nitrogen than oxygen.

The gate electrodes (623 and 624), the plugs (641 to 646), the electrodes (651 to 657), the wiring and the electrodes (661 to 663), and the wirings (671 and 672) can be formed using a single layer of conductive film or a multilayer of two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

The OS layer 660 of the OS transistor 503 can be formed of a single layer of an oxide film or a multilayer of two or more oxide semiconductor films. The oxide semiconductor film is preferably formed using an oxide semiconductor containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, the oxide may contain an element other than In, Ga, Sn, and Zn, for example, an oxide semiconductor containing $SiO_2$.

Note that, for example, an In—Ga—Zn oxide means an oxide containing In, Ga, and Zn and there is no particular limitation on the atomic ratio of In, Ga, Zn, and O.

Typical crystal structures of an oxide semiconductor film serving as the OS layer 660 are a single crystal structure, a microcrystalline structure, a polycrystalline structure, and an amorphous structure. The OS layer 660 preferably contains a c-axis aligned crystalline oxide semiconductor (CAAC-OS) film in a region functioning as a channel.

A crystal structure in an oxide semiconductor film is described below. An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like. An oxide semiconductor film may be a stacked film including two or more films of an amorphous oxide semiconductor film, a microcrystalline oxide semiconductor film, and a CAAC-OS film, for example.

In the following description of a crystal structure, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is from 80° to 100°, and accordingly includes the case where the angle is from 85° to 95°.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis (f scan) is performed under conditions where the sample is rotated around a normal vector of a sample surface as an axis (f axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

In an OS transistor using the CAAC-OS film, change in electric characteristics of the transistor due to irradiation with visible light or ultraviolet light is small. Thus, the OS transistor has high reliability.

<Configuration Example of IC Chip>

Figure 8:
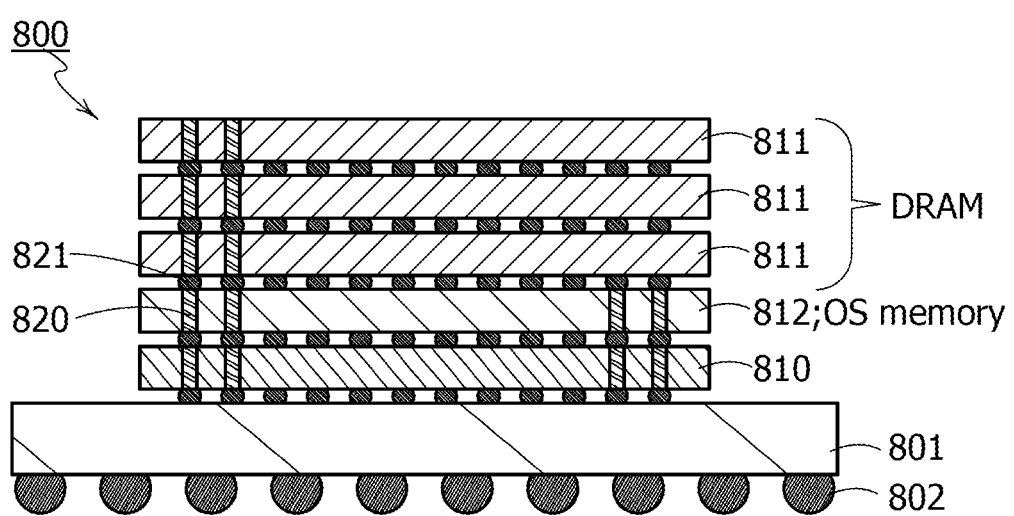
FIG. 8 illustrates one structural example of an IC chip serving as a processing device.

Next, one example of an IC chip serving as the processing device 10 is described. The processing device 10 can be one IC chip by mounting a plurality of dies on a package substrate. Stacking the plurality of dies results in the processing device 10 which is a three-dimension integrated circuit (3D IC). FIG. 8 illustrates one example of the structure.

In an IC 800, a plural kinds of dies (810, 811, and 812) are stacked over a package substrate 801. On the package substrate 801, a solder ball 802 is provided to connect the IC 800 to a printed board or the like. A through electrode 820 and a bump 821 connect the dies (810, 811, and 812) and the package substrate 801.

A processor die 810 is a die in which a circuit serving as the processor 20 is formed. The processor die 810 may further include a circuit serving as the clock signal management unit 22 and/or the power management unit 23.

Memory dies 811 and 812 each include a circuit serving as the main memory 21. The memory die 811 serves as the volatile memory 31. The memory die 812 serves as the nonvolatile memory 32. Here, the volatile memory 31 is a DRAM and the nonvolatile memory 32 is an OS memory. Hereinafter, the memory die 811 is also referred to as DRAM die 811 and the memory die 812 is also referred to as OS memory die 812.

Note that in an example of FIG. 8, the main memory 21 includes three DRAM dies 811 and one OS memory die 812. However, the number of dies is not limited to that in the example of FIG. 8. In addition, the number of the processor die 810 may be two or more.

The OS transistor shows low temperature dependence of electrical characteristics, in comparison with a Si transistor. On the other hand, a DRAM, which has a memory cell with a Si transistor, needs a higher refresh rate as temperature is increased. The high refresh frequency results in increase in power consumption of the DRAM. To prevent increase in temperature of the DRAM die 811 caused by heat generation in the processor die 810, the OS memory die 812 which is hardly affected by heat is stacked to be closest to the processor die 810.

As illustrated in FIG. 8, the DRAM die 811 is not directly connected to the processor die 810, whereby increase in the refresh rate of the DRAM due to heat can moderate. The through electrode 820 connects the OS memory die 812 and the processor die 810, whereby low response speed of the OS memory can be cancelled by using a wiring thicker than a bonding wiring.

This embodiment can be implemented in appropriate combination with any of the structures described in the other embodiments.

(Embodiment 3)

The processing device 10 in FIG. 1 can be used as processing devices of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. Specific examples of these electronic devices are shown in FIGS. 9A to 9F.

Figure 9A:
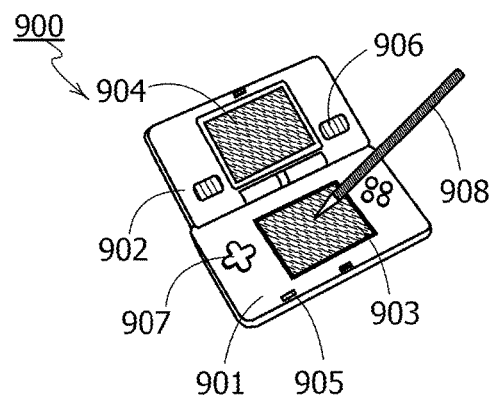
FIGS. 9A to 9F are external views illustrating examples of electronic devices.

FIG. 9A is an external view illustrating a structure example of a portable game machine. The portable game machine 900 includes a housing 901, a housing 902, a display portion 903, a display portion 904, a microphone 905, a speaker 906, an operation key 907, a stylus 908, and the like.

Figure 9B:
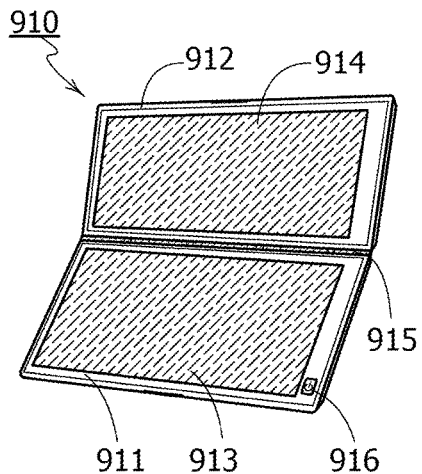

FIG. 9B is an external view illustrating a structure example of a portable information terminal. The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and an angle between the housing 911 and the housing 912 can be changed with the joint 915. An image on the display portion 913 may be switched depending on the angle between the housing 911 and the housing 912 at the joint 915. A display device with a position input function may be used as at least one of the display portion 913 and the display portion 914. Note that the position input function can be added by providing a touch panel in a display device. Alternatively, the position input function can be added by providing a photoelectric conversion element called a photosensor in a pixel portion of a display device.

Figure 9C:
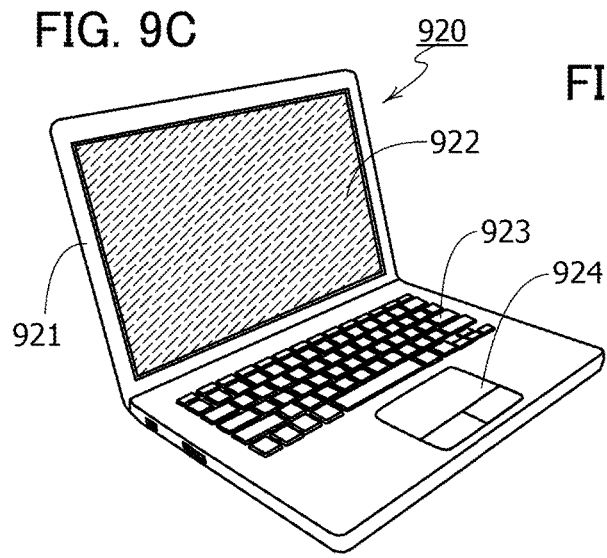

FIG. 9C is an external view illustrating a structure example of a laptop. The laptop 920 includes a housing 921, a display portion 922, a keyboard 923, a pointing device 924, and the like.

Figure 9D:
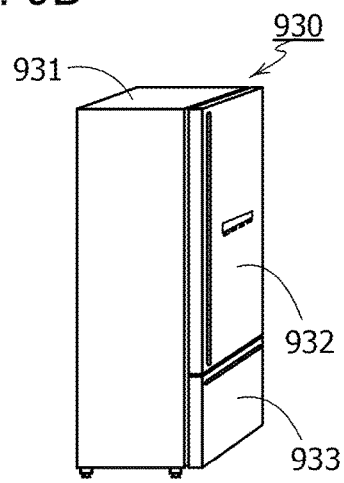

FIG. 9D is an external view illustrating a structure example of an electric refrigerator-freezer. The electric refrigerator-freezer 930 includes a housing 931, a refrigerator door 932, a freezer door 933, and the like.

Figure 9E:
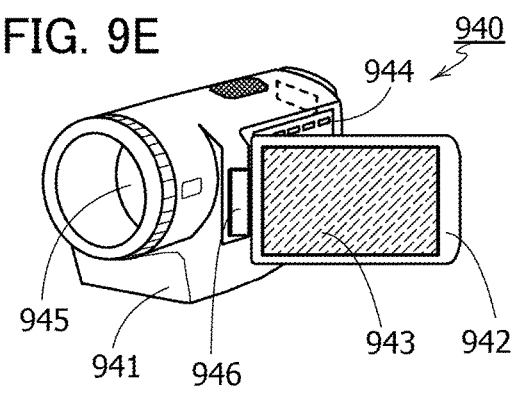

FIG. 9E is an external view illustrating a structure example of a video camera. The video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housing 941 and the housing 942.

Figure 9F:
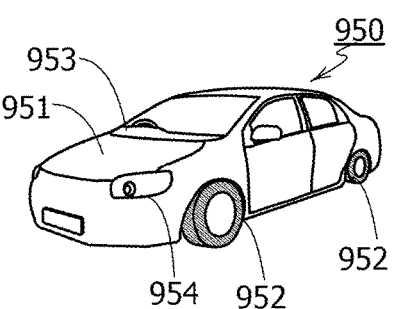

FIG. 9F is an external view illustrating a structure example of a motor vehicle. The motor vehicle 950 includes a car body 951, wheels 952, a dashboard 953, lights 954, and the like.

This implementation can be implemented in appropriate combination with any of the other implementations and the like.

This application is based on Japanese Patent Application serial no. 2013-095552 filed with Japan Patent Office on Apr. 30, 2013, the entire contents of which are hereby incorporated by reference.

What is claimed is:

1. A method for driving a semiconductor device including a volatile memory and a nonvolatile memory, the method comprising the steps of:
   operating the volatile memory with a normal mode;
   monitoring access requirements to the volatile memory and detecting an access frequency of the volatile memory;
   comparing a used space of the volatile memory and an available space of the nonvolatile memory when the access frequency of the volatile memory is smaller than a first set value;
   forwarding data stored in the volatile memory to the nonvolatile memory when the used space of the volatile memory is smaller than the available space of the nonvolatile memory;
   changing the volatile memory from the normal mode to a stop mode;
   monitoring access requirements to the nonvolatile memory and measuring a data transferring speed of the nonvolatile memory;
   returning the volatile memory from the stop mode to the normal mode when the data transferring speed of the nonvolatile memory is higher than a second set value; and
   forwarding part of data in the volatile memory to the nonvolatile memory when an available space of the volatile memory is smaller than a third set value,
   wherein the third set value is configured to be changed depending on temperature of the volatile memory;
   wherein the normal mode is a mode supplying a first power supply voltage to the volatile memory, and
   wherein the stop mode is a mode not supplying any power supply voltage to the volatile memory.

2. The method for driving the semiconductor device according to claim 1, further comprising the steps of:
   forwarding part of data in the volatile memory to the nonvolatile memory when the used space of the volatile memory is larger than the available space of the nonvolatile memory;
   operating the volatile memory with a power saving mode;
   monitoring access requirements to the nonvolatile memory and determining whether data required to be read is written to the nonvolatile memory; and
   returning the volatile memory from the power saving mode to the normal mode when the data required to be read is not written to the nonvolatile memory, wherein the power saving mode is a mode supplying a second power supply voltage to the volatile memory, and wherein the first power supply voltage is higher than the second power supply voltage.

3. The method for driving the semiconductor device according to claim 2, further comprising the step of returning the volatile memory from the power saving mode to the normal mode when the available space of the nonvolatile memory is smaller than a size of data required to be written.

4. The method for driving the semiconductor device according to claim 1, wherein the volatile memory is DRAM, wherein the access frequency of the volatile memory is time intervals between access requirements to the DRAM, and wherein refresh intervals of DRAM is applied as the first set value.

5. The method for driving the semiconductor device according to claim 1, wherein the first set value is configured to be changed depending on temperature of the volatile memory.

6. The method for driving the semiconductor device according to claim 1, wherein the second set value is configured to be changed depending on temperature of the volatile memory.

7. The method for driving the semiconductor device according to claim 1, wherein all the data stored in the in the volatile memory is forwarded to the nonvolatile memory.

* * * * *